United States Patent [19]

Griffus et al.

[11] Patent Number: 5,323,353
[45] Date of Patent: Jun. 21, 1994

[54] METHOD AND APPARATUS FOR REPAIR OF MEMORY BY REDUNDANCY

[75] Inventors: Michael J. Griffus; Robert G. Pollachek, both of Vancouver, Wash.; Giao N. Pham, Austin, Tex.

[73] Assignees: Sharp Microelectronics Technology Inc., Camas, Wash.; Sharp Kabushiki Kaisha, Osaka, Japan

[21] Appl. No.: 44,958

[22] Filed: Apr. 8, 1993

[51] Int. Cl.5 .............................................. G11C 11/40
[52] U.S. Cl. .................................. 365/226; 365/189.01
[58] Field of Search ........... 365/226, 227, 228, 189.01, 365/189.09

[56] References Cited

U.S. PATENT DOCUMENTS 5,193,073  3/1993  Bhuva ................................. 365/226

OTHER PUBLICATIONS

Kitsukawa et al., 256Mb DRAM Technologies for File Applications, 1993 IEEE International Solid-State Circuits Conference, pp. 48-49, 261.

Primary Examiner—Terrell W. Fears
Attorney, Agent, or Firm—Fliesler, Dubb, Meyer & Lovejoy

[57] ABSTRACT

A method of, and apparatus for, decoupling a defective or otherwise non-operational memory block from the power lines of a memory device is disclosed. Defects which cause excessive current consumption in defective memory blocks can be repaired through this approach. Mass-production yields can be improved significantly.

18 Claims, 3 Drawing Sheets

METHOD AND APPARATUS FOR REPAIR OF MEMORY BY REDUNDANCY

BACKGROUND

1. Field of the Invention

The invention relates generally to repair of memory by redundancy. The invention relates more specifically to a method of reducing power consumption in a memory having a redundancy-based repair system.

2. Description of the Related Art

High density memory devices typically include a redundancy-based repair system for substituting redundant rows or columns of memory cells for use in place of non-operational or defective primary rows or columns.

When a defective primary row or column (hereafter, primary memory block) is detected within a memory device, the row or column addressing mechanism of the device is reprogrammed to select an operative redundant memory block in place of the defective primary block.

This reprogramming or "select-substituting" step works by disabling all requested couplings of the local data read and/or data write lines of the defective memory block to the global read and/or write lines of the memory device. The select-substituting step also enables a substitute coupling of the local data read and/or write lines of the redundant memory block to the global read and/or write lines of the memory device in response to access requests directed at the defective memory block. Data which would have been stored in or read from the defective primary block is instead written to or fetched from the redundant memory block.

SUMMARY OF THE INVENTION

The above procedure overlooks the possibility that a defective memory block might continue to draw power through its bit line load paths even though its read and/or write lines have been decoupled from the global read and/or write lines. This can be troublesome, particularly when the defective memory block has a defect which draws excessive current even after the read and/or write lines of the defective block have been decoupled from the global read and/or write lines. In other words, repair of a storage-function defect does not necessarily correct a concomitant leakage current problem unless additional steps are taken to shut off such leakage when the storage-function repair is made.

The invention overcomes the above-mentioned problems by providing a method and apparatus for decoupling a defective or otherwise non-operational memory block from the power lines of a memory device. Such decoupling is preferably carried out when the non-operational defective memory block is designated as non-operational and replaced by a redundant memory block. Unused redundant memory blocks may be similarly decoupled from the power lines. Defects which cause excessive current consumption in defective memory blocks are thus repaired. Mass-production yields can be improved significantly.

The invention is particularly useful when applied to memory devices that need to have relatively low power consumption ratings when placed in a standby mode. The low-power standby-mode is typically used in battery powered applications such as portable computers.

A memory device in accordance with the invention comprises: (a) one or more data lines; (b) a power line; (c) a plurality of memory blocks for storing data, where each memory block has one or more memory cells and each memory block has one or more bitlines for coupling the respective memory cells of the memory block to the one or more data lines; (d) a plurality of bitline-loading means, operatively coupled between the power line and respective bitlines of the plurality of memory blocks, for coupling the respective bitlines to the power line, where at least one of the bitline-loading means is switchable from a bitline loading mode to a nonloading mode that decouples the corresponding bitline from the power line; (e) non-operational designating means for designating one or more of the memory blocks as being defective or otherwise non-operational; and (f) power control means, responsive to the non-operational designating means and operatively coupled to the at least one switchable bitline-loading means, for switching the at least one switchable bitline-loading means to the nonloading mode when the corresponding memory block is designated as being defective or otherwise non-operational by the non-operational designating means.

For a memory device having plural memory blocks each including a bitline that is normally coupled by a bitline-loading means to a power line, a method in accordance with the invention comprises the steps of: (a) designating one or more memory blocks of the memory device as being defective or otherwise non-operational; and (b) decoupling the corresponding bitline from the power line.

BRIEF DESCRIPTION OF THE DRAWINGS

The below detailed description makes reference to the accompanying drawings, in which.

DETAILED DESCRIPTION

Figure 1:
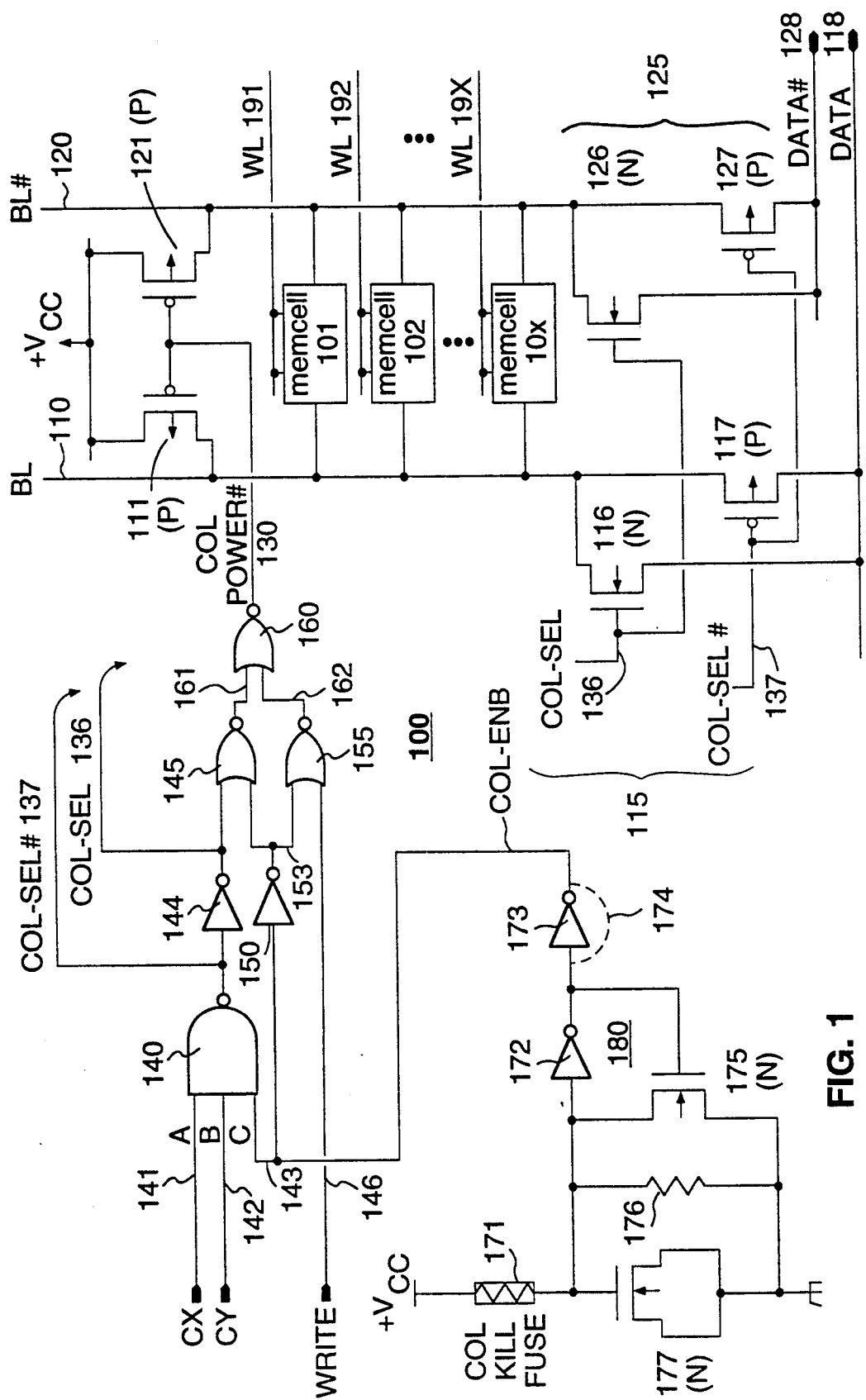
FIG. 1 is a schematic diagram illustrating a power-line to bit-line decoupling circuit in accordance with the invention.

FIG. 1 shows a column select/disable circuit 100 which includes a power-line to bit-line decoupling sub-circuit (111, 121, 145, 150, 155, 160) in accordance with the invention. Circuit 100 is preferably provided on an integrated circuit chip having many like circuits.

A plurality of SRAM (static random access memory) cells 101, 102, . . . 10X are shown arranged vertically within column select/disable circuit 100 to form a column of memory cells between first and second bit lines 110 and 120. The number of memory cells 101–10X provided in the column can vary from design to design. One embodiment provides four such memory cells 101–10X per column. Another embodiment provides 256 memory cells 101–10X per column. Word lines 191, 192, . . . , 19X extend horizontally to respective memory cells 101, 102, . . . 10X for selecting a specific cell within the illustrated memory column.

Incidentally, the term "memory block" is used herein to refer to any group of memory cells (e.g., column, row or other organization) which is uniquely addressable or otherwise selectable. It is to be understood that discussions directed to memory columns are extendable to otherwise-organized memory blocks.

A first P-channel enhancement type field effect transistor 111 (hereafter, P-transistor) provides a resistive load path between the first bit line 110 (hereafter, prime bit line 110) and a +Vcc power line when the gate of the transistor 111 is pulled low (to a voltage substantially below that at the source of the transistor). The channel width of column-loading transistor 111 is set to provide a desired amount of loading current on prime bit line 110. In similar fashion, a second P-channel transistor 121 provides a resistive load path between the second bit line 110 (hereafter, complementary bit line 120) and the +Vcc power line when the gate of that transistor 121 is pulled low. The channel width of column-loading transistor 121 is set to provide a desired amount of loading on complementary bit line 120. Typically, bitlines 110 and 120 will be substantially identical and column-loading transistors 111 and 121 will be substantially identical.

The gates of column-loading transistors 111 and 121 are tied together and driven by a COL-POWER# signal (read this as column power-not or column power-bar) provided on power control line 130. Although not shown, the column-loading P-transistors, 111 and 121, are preferably positioned midway along the vertical extent of the prime and complementary bit lines, 110 and 120, for the purpose of minimizing signal propagation delay through the column bit lines.

A first transfer (or "transmission") gate 115, which is formed by N-transistor 116 and P-transistor 117, is provided to selectively couple prime bit line 110 to a prime data line 118 (DATA). A second transfer gate 125, which is formed by N-transistor 126 and P-transistor 127, is provided to selectively couple complementary bit line 120 to a complementary data line 128 (DATA#). Transfer gates 115 and 125 are typically matched to have substantially identical characteristics. A prime column select line 136 delivers a COL-SEL signal to the gates of N-transistors 116 and 126. A complementary column select line 137 delivers an opposed COL-SEL# signal to the gates of P-transistors 117 and 127.

NAND gate 140 outputs the COL-SEL# signal onto line 137 in response to two column select signals, CX and CY, and a column-enable signal (COL-ENB) provided at respective inputs 141, 142 and 143. An inverter 144 having an input coupled to the output of NAND gate 140 produces the COL-SEL signal. The column select signals, CX and CY, at inputs 141 and 142 represent addressing product terms that are produced by an addressing circuit (not shown) of the memory device (integrated circuit chip) and are used for selecting the illustrated memory column as opposed to other memory columns (not shown).

In a one megabit embodiment, the memory array is conceptually organized as 1K rows by 1K primary columns, each column having 1,024 (1K) memory cells. (Other organizations that form a total of one megabits of primary storage are of course possible. The number of redundant columns or redundant rows added to this mix will vary depending on the degree and kind of redundancy desired.) Data is output from or input to the one megabit embodiment as 8-bit wide parallel words (bytes). The 8 bits correspond to 8 simultaneously selected columns and one selected word line. The column select logic is therefore organized to couple the bits of 8 simultaneously selected columns to a corresponding set of 8 primary data lines such as line 118 and 8 complementary data lines such as line 128.

Memory block redundancy can be organized differently however. In the one megabit embodiment, columns are grouped into replaceable blocks of four columns each in order to provide nibble-sized substitution. This means that each independently-set or reset COL-ENB signal is used to enable four memory columns. The ratio of column-kill fuse circuits (171–177) to columns is one to four. (Other ratios such as 1:2 or 1:8 or higher are of course possible.) This 1:4 arrangement has the advantage of enabling repair of byte-sized data blocks with nibble-sized redundant memory blocks. Less die area is needed to support nibble-wide redundant memory blocks as compared to byte-wide redundant memory blocks. If there is a defect in an upper half of a byte-wide primary memory block, the non-defective 4 columns that form the lower half of the byte-wide primary memory block do not have to be wasted. Instead, a nibble-wide redundant memory block is substituted in for the defective upper half of the byte-wide primary memory block.

The COL-ENB signal for the illustrated memory column is held high on NAND input line 143 as long as a laser-cuttable, column-kill fuse 171 (preferably a silicide link) associated with the illustrated memory column remains intact. Column-kill fuse 171 has one end connected to the +Vcc power line and a second end coupled to an input of a first inverter 172. The output of first inverter 172 connects to an input of a second inverter 173. The output of second inverter 173 connects to NAND input line 143 and produces the COL-ENB signal. A logic high ("1") state of the COL-ENB signal designates the corresponding memory block as being operational.

The term "operational" is used herein to refer to a non-defective memory block that can function to reliably store data and output that data when addressed during a read operation and, if the memory device is a writable one, the term further indicates that the referenced memory block can reliable input and store new data when addressed during a write operation. The complementary term "non-operational" refers to a memory block that for reason of defect or otherwise, does not function as an operational memory block.

The output of first inverter 172 also connects to the gate of an N-transistor 175 to form a column-disable latch 180. The drain of N-transistor 175 connects to the input of first inverter 172. The source of N-transistor 175 connects to ground. Capacitor 177 and resistor 176 are connected in parallel across the source and drain of N-transistor 175 for providing stabilization and for pulling the input of first inverter 172 to logic low ("0") in the case where column-kill fuse 171 is cut open. As seen, capacitor 177 is formed of an N-transistor having source and drain terminals connected to ground and a gate coupled to the input of first inverter 172.

Column-kill fuse 171 has to be at least partially intact (conductive) in order to hold the output of column-disable latch 180 at logic high ("1"). If a defect is detected during device testing in the illustrated memory column (101, 102, ... 10X), a laser beam is used to cut column-kill fuse 171 open. Resistor 176 discharges capacitor 177 and pulls the input of first inverter 172 low. This sets the output of column-disable latch 180 to logic high ("1") and drives the COL-ENB signal of line 143 to logic low ("0").

Resistor 176 should have a much larger resistance than column-kill fuse 171 so that fuse 171 determines the voltage at the input of first inverter 172. The value of resistor 176 is preferably on the order of $10^7$–$10^{12}$ ohms. Capacitor 177 should have a substantially larger capacitance than the gate capacitances at the input of inverter 172.

In a so-called TFT (thin film transistor) variation of the circuit, second inverter 173 is eliminated as indicated by optional short 174; the ground and +Vcc power line connections of elements 171, 177, 176 and 175 are reversed (so that column-kill fuse 171 pulls the input of first inverter 172 to ground); transistors 175 and 176 are implemented as PMOS transistors rather than NMOS; and an appropriately sized P-channel transistor (not shown) having its gate tied to ground is used to implement resistor 176. This resistance-providing P-channel transistor (not shown) is a thin film transistor (TFT) formed in a polysilicon layer spaced above the substrate. The reason the thin film transistor is used instead of a resistive line is because it is difficult to form high-resistance polysilicon resistors in TFT structures.

A memory block whose column-kill fuse 171 has been cut is referred as a "killed" memory block. A memory block whose column-kill fuse 171 has been left intact is referred as an "alive" memory block.

An inverter 150 having an input coupled to receive the COL-ENB signal (line 143) is provided for generating a complementary COL-DIS signal (column disable) on line 153. The COL-DIS signal (line 153) drives an input of each of NOR gates 145 and 155. A second input of NOR gate 145 receives the COL-SEL signal (line 136). A second input of NOR gate 155 receives a WRITE signal along line 146. The outputs of first and second NOR gates 145 and 155 connect to respective first and second inputs (161 and 162) of a third NOR gate 160. The output of NOR gate 160 connects to the gates of transistors 111 and 121.

If the COL-ENB signal is at logic high ("1")—as it would be when the illustrated memory column (101, 102, . . . 10X) is nondefective and column-kill fuse 171 is kept intact—then column select signals, CX and CY, may be applied to NAND gate 140 for the purpose of selecting or de-selecting the illustrated memory column and respectively establishing a conductive path through first and second transfer gates 115 and 125 or creating an open circuit at transfer gates 115 and 125. In this situation where the memory block is "alive", a logic low ("0") COL-DIS signal appears at the respective first inputs 153 of first and second NOR gates 145 and 155.

If column select signals, CX and CY, are both at logic high ("1") while line 143 is high, the illustrated memory column is "selected" and a logic high ("1") COL-SEL signal (136) appears at the input of NOR gate 145 to drive NOR gate 145 to output a logic low ("0") to input 161 of NOR gate 160.

If the WRITE line 146 goes to logic high ("1") while the illustrated memory column is "selected" (that is, while a "0" appears at input 161 of NOR gate 160) and while the illustrated memory column is "alive" (COL-DIS equals "0"), then respective logic lows ("00") appear on inputs 161 and 162 of NOR gate 160. In response, NOR gate 160 outputs a logic high ("1") onto the power control line 130 and thus turns off column-loading transistors 111 and 121. Accordingly, the column-loading transistors 111 and 121 are switched off during a WRITE to a selected and alive memory block. This helps to minimize the time and power needed for writing new data to a selected memory cell.

If the WRITE signal is at logic low ("0") and the memory block is "alive", a pair of logic lows ("00") appear at the inputs of NOR gate 155. NOR gate 155 outputs a logic high ("1") to input 162 of NOR gate 160. In response, NOR gate 160 pulls the gates of P-transistors 111 and 121 low to thereby turn on these transistors 111 and 121. This insures that during a read, all alive memory blocks (whether selected or de-selected) have their bitlines 110, 120 resistively coupled to the +Vcc power line. Word lines 191, 192, . . . , 19X are used to select a desired cell from the selected memory column.

If one of column select signals, CX and CY, is at logic low ("0") while line 143 is high, the illustrated memory column is "de-selected" and a logic low ("0") COL-SEL signal appears at input 136 of NOR gate 145. The combination of logic lows ("00") at the inputs of NOR gate 145 causes NOR gate 145 to output a logic high ("1") to input 161 of NOR gate 160. This forces NOR gate 160 to drive the power control line 130 low and turn on column-loading transistors 111 and 121. Thus, the column-loading transistors 111 and 121 of an alive and de-selected memory block are automatically turned on. This mechanism biases the alive bitlines to a fixed voltage while their memory blocks are de-selected. This inhibits undesirable noise signals from developing along the bitlines, 110 and 120, of each alive and de-selected memory block that has the structure shown in FIG. 1.

The immediately foregoing discussion assumed that the memory block was "alive". On the other hand, if the illustrated memory column is "killed" and the COL-ENB signal is therefore switched to logic low ("0")—as it would be when the illustrated memory column is defective and the column-kill fuse 171 has been cut—then inverter 150 applies a logic high ("1") to inputs 153 of first and second NOR gates 145 and 155. In response, NOR gates 145 and 155 output logic lows ("00") to respective inputs 161 and 162 of NOR gate 160. NOR gate 160 then outputs a logic high ("1") COL-POWER# signal to power control line 130. This turns off column-loading transistors 111 and 121 and thereby decouples the +Vcc power line from the illustrated bit lines 110-120. A "killed" memory block is thereby prevented from drawing current from the +Vcc power line by way of its bit lines 110-120.

While not shown, it is understood that the memory device has many column select/disable circuits similar to the illustrated column select/disable circuit 100 and that a corresponding column-kill fuse (171), column-power control line (130) and set of column select lines (136-137) are provided for each of the unshown column select/disable circuits together with the associated logic (140-160, 171-180). The per memory block overhead for providing the power control function of line 130 is represented by inverter 150 and NOR gates 145, 155 and 160. The advantage derived from this overhead is seen by referring to FIG. 2.

While the foregoing discussion has been directed to primary memory blocks that are normally alive and are "killed" after a defect is detected in them, it is to be understood that a complementary same approach can be taken for redundant memory blocks that are normally "killed" and are brought to life in order to replace a primary memory block. The structure for such complementary redundant memory blocks is essentially the same as that shown in FIG. 1 with the exception that inverter 173 is removed and dashed connection 174 is substituted for it. This has the effect of reversing the functions of elements 171, 143 and 153. Element 171 becomes the spare column-enabling fuse instead of the prime column-kill fuse. Element 180 continues to function as the column-disable latch. Line 143 carries the COL-DIS signal instead of the COL-ENB signal. And line 153 carries the COL-ENB signal instead of the COL-DIS signal. A plurality of fuse-activated transmission gates (not shown) can be used to route the column select signals, CX and CY, of a killed primary memory block to the CX and CY terminals of the redundant memory block that replaces it.

It is not necessary to provide the power-line to bitline decoupling function to all memory blocks of an integrated memory circuit in order to enjoy the benefits of the invention. It is sufficient to provide the function in a statistically significant number of the memory blocks. By way of example, if the power-line to bitline decoupling function is provided in 50% of the memory blocks of a mass-produced integrated memory circuit, yield loss due to excess current consumption can be cut by a corresponding 50%. This can increase production yields substantially if a major portion of production yield loss is due to excess current consumption that is correctable by the power-line to bitline decoupling function of the invention.

In one particular embodiment of the invention, the ratio of redundant memory blocks to primary memory blocks is set at one to sixteen (e.g., one spare nibble for every sixteen primary nibbles). The power-line to bitline decoupling function is provided in all the primary memory blocks but in none of the redundant memory blocks. Since the likelihood of a defect occurring in a redundant memory block is roughly one sixteenth that of a defect occurring in a primary memory block, it was decided that the savings in die space consumption and the resulting increase of memory capacity outweighed the potential loss in yield due to excess current draw in the unprotected spare blocks. Those skilled in the art will, of course, appreciate that other mixes of providing the power-decoupling function in some memory blocks but not in others can lead to a desired balance between yield improvement due to power-line decoupling and storage capacity improvement due to less consumption of die area. (Yield is itself, generally speaking, an inverse function of memory cell size and die size, and also a direct function of defect repairability. So a tradeoff has to be made between: (1) reducing the per-cell consumption of die space in order to squeeze a given storage capacity into less die area and thereby increase yield; or (2) providing more defect repairability in order to increase yield. The tradeoff is made on an empirical basis and based on statistically expected distributions of defects, such statistical predictions being well known in the art.

Repairability of defect mechanisms, as provided by the present invention, will now be described with reference to SRAM memory cells. It is to be understood, however, that the invention can be beneficially applied to other types of memory cells such as EPROM or EEPROM cells (floating gate devices) and the like.

Figure 2:
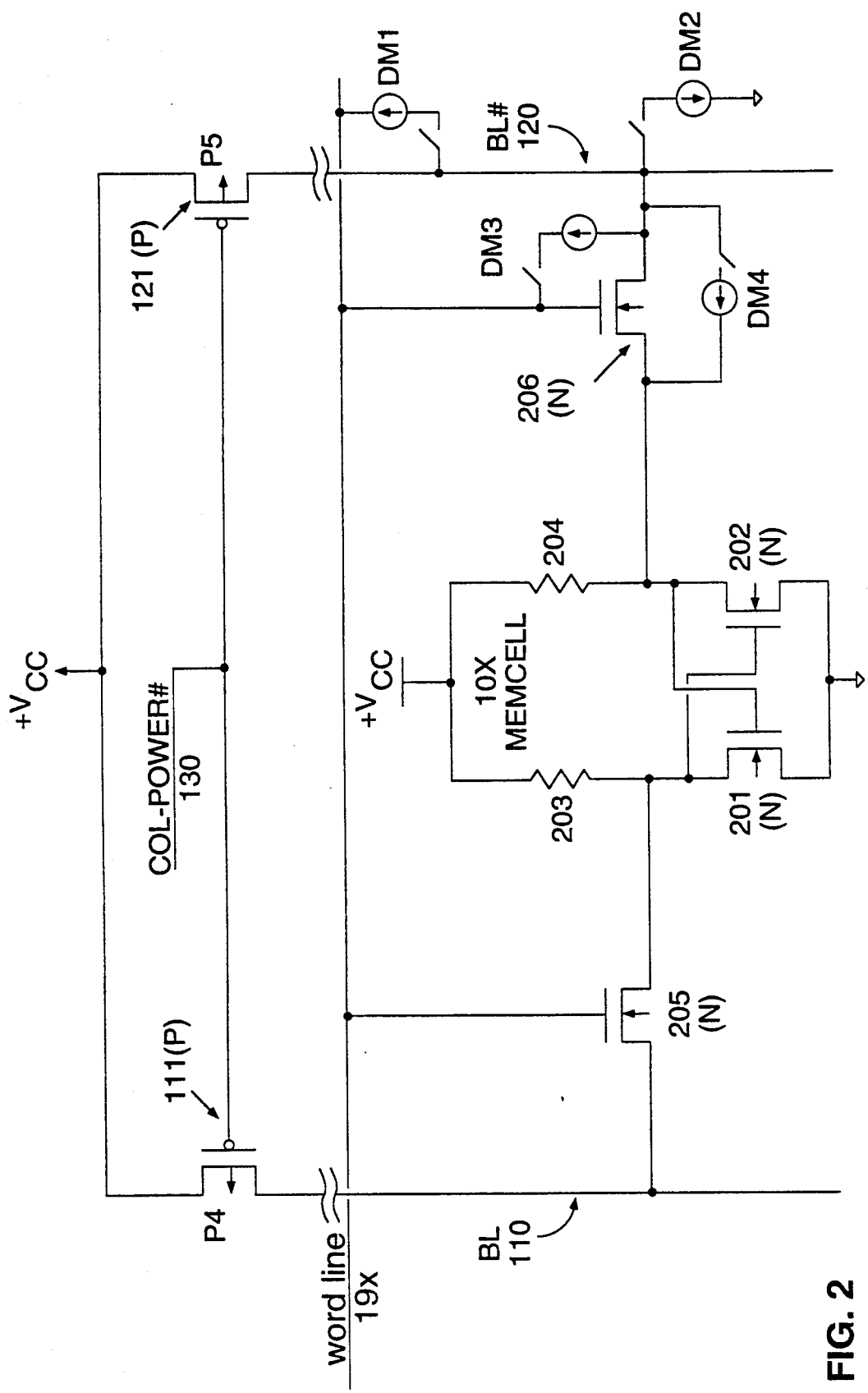
FIG. 2 is a schematic diagram showing defect mechanisms (DM) that are overcome by using the power-line to bit-line decoupling method of the invention.

FIG. 2 shows an SRAM version of one of the memory cells, 10X, in greater detail. The illustrated memory cell 10X is a four transistor SRAM structure comprised of cross-coupled first and second, N-channel, data transistors 201 and 202, first and second resistive loads 203 and 204; and first and second, N-channel, pass transistors 205 and 206. Pass transistor 205 has a gate connected to word line 19X, a source connected to prime bit line 110, and a drain connected to the drain of data transistor 201 and one end of resistive load 203. In similar fashion, pass transistor 206 has a gate connected to word line 19X, a source connected to complementary bit line 120, and a drain connected to the drain of data transistor 202 and one end of resistive load 204. Column-loading transistors 111 and 121 are shown respectively coupling the +Vcc power line to prime bit line 110 and complementary bit line 120 in response to the COL-POWER# signal of power control line 130.

A combination symbol of a switch in series with a current direction bubble is used in FIG. 2 to represent each of a plurality of possible defect mechanisms, DM1 through DM4.

Those skilled in the art recognize that conductors are often formed in integrated circuits as combinations of metal and polysilicon. Defect mechanism DM1 represents the possibility of a metal-to-metal or a metal-to-polysilicon short forming between the word line 19X and one or both of the bitlines 110-120 of a given column. (Although DM1 is shown at the intersection of complementary bit line 120 and word line 19X, it is understood that it can also occur at the intersection of prime bit line 110 and word line 19X.) A metal-to-metal short can form either as a bridge between two metal lines of a same metal level (e.g., metal-1 or metal-2) or as a pinhole through an insulator separating metal lines of different metal levels (e.g., metal-1 and metal-2). A metal-to-poly short can form as a pinhole through an insulator separating metal and polysilicon lines of different levels (e.g., metal-1 and poly-2).

Defect mechanism DM2 represents the possibility of a metal-to-metal or a metal-to-polysilicon or metal-to-substrate short forming between one of the bitlines 110-120 and ground. Isolation oxide or junction failures are included as part of defect mechanism DM2.

Defect mechanism DM3 represents the possibility of a gate-to-source short (e.g., oxide pinhole) developing in one of the pass transistors 205-206.

Defect mechanism DM4 represents the possibility of a drain-to-source short (e.g., defect in substrate crystal) developing in one of the pass transistors 205-206.

It is seen from FIG. 2 that the step of raising the COL-POWER# signal to logic high ("1") breaks open the current paths from the +Vcc power line to the bitlines 110-120 and in so doing, prevents power drain by one or more of defect mechanisms DM1-DM4. Significant increases in mass-production yields can be obtained by eliminating excessive current drain due to one or more of defect mechanisms DM1-DM4. As such, the invention provides a method and circuit structure for repairing these kinds of defects.

Figure 3:
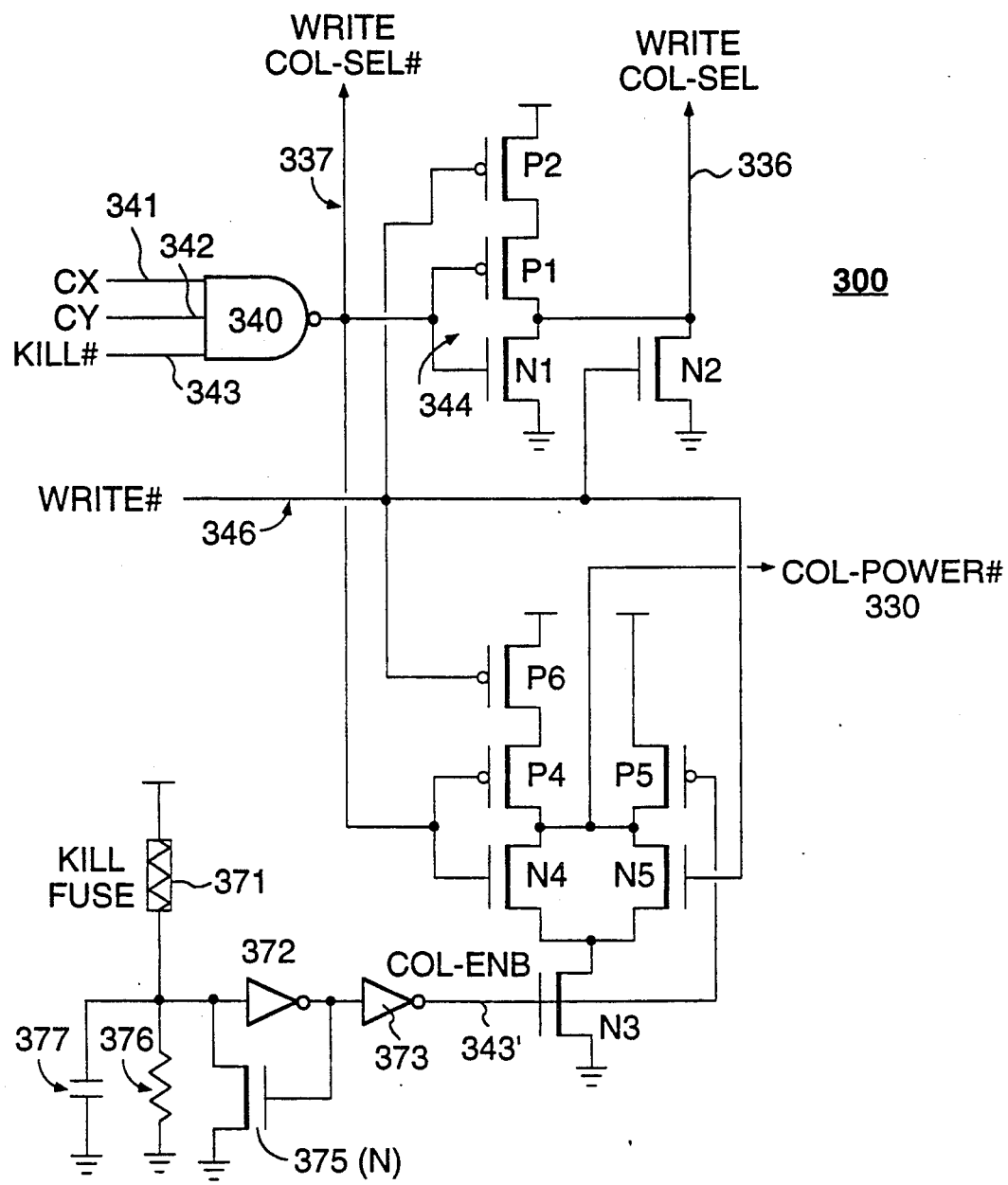
FIG. 3 is a schematic diagram illustrating a transistor-level realization of a power-line to bit-line decoupling circuit in accordance with the invention.

Referring to FIG. 3, there are many ways to implement the invention. FIG. 3 shows a transistor level implementation 300. Like reference symbols and numbers in the "300" series are used for elements of FIG. 3 which correspond to but are not necessarily the same as the elements represented by similar symbols and reference numbers of the "100" series in FIG. 1. As such, some of the descriptions for elements found in FIG. 3 will be omitted here.

Elements 371 through 377 form the column-kill circuit as in FIG. 1. The output of inverter 373 is referenced as 343'. NAND gate 340 outputs a Write COL-SEL# signal onto line 337 in response to two column select signals, CX and CY, and a Column-KILL# signal provided at respective inputs 341, 342 and 343. (Column-KILL# line 343 is typically connected directly to COL-ENB line 343'. An alternate embodiment might, however, connect Column-KILL# line 343 to the drain of transistor 375 or to a second fuse circuit (not shown) which is actuated independently of fuse 371.)

In this particular embodiment 300, separate I/O buses are provided for read and write operations. Independent read and write column selects and transfer gates are provided for each memory column. The Read COL-SEL and Read COL-SEL# signals are not shown.

An inverter 344 composed of complementary P-channel and N-channel transistors P1 and N1 is provided for producing the Write COL-SEL signal. Inverter 344 has its input coupled to the output line 337 of NAND gate 340 and its output coupled to the Write COL-SEL line 336. P-channel transistor P2 is interposed between the source of P1 and the +Vcc power line. Transistor N2 has a drain connected to the Write COL-SEL line 336 and a source tied to ground. Line 346 carries the WRITE# signal (write-not or write-bar) rather than a WRITE signal. The WRITE# line 346 connects to the gates of P2 and N2. If the WRITE# signal is at logic high ("1"), N2 turns on to pull the Write COL-SEL line 336 low and P2 shuts off, thereby preventing inverter 344 from driving the Write COL-SEL line 336 high. (The combination of transistors N1, P1, N2 and P2 defines a NOR gate.)

A COL-POWER# signal is output onto power control line 330 by a circuit comprised of N-channel transistors, N3, N4, N5 and P-channel transistors, P4, P5, and P6. The gates of N3 and P5 receive a COL-ENB signal from output 343' of inverter 373. The source of N3 connects to ground. The drain of N3 connects to the sources of N4 and N5. The drains of N4, N5, P4 and P5 all tie to the COL-POWER# line 330. The source of P5 connects to the +Vcc power line. The source of P4 connects to the drain of P6 and the source of P6 in turn connects to the +Vcc power line. (The combination of transistors N3, N4, N5, P4, P5 and P6 defines a complex AND-OR-invert gate. Such a complex is advantageous over gates 150, 155, 160 of FIG. 1 in that it consumes less die area and it provides less delay in generating the COL-POWER# signal (330) in response to a switching of the column select signals, CX and CY.)

The COL-ENB line 343'0 has to be at logic high ("1") to turn on N3 and thereby form a conductive path through N3 for pulling the COL-POWER# line 330 low. (Although not shown, it is understood that the COL-POWER# line 330 connects to the gates of P-channel column-loading transistors such as 111 and 121 of FIG. 1.) If COL-ENB 343' is low (meaning the memory block is "killed"), P5 turns on to pull the COL-POWER# line 330 to logic high ("1"), thereby decoupling the corresponding memory block bitlines (110', 120', not shown) from the +Vcc power line.

If the Write COL-SEL# signal is low (meaning the column is selected), N4 turns off and P4 turns on. If WRITE# signal (346) is low at the same time (meaning a write operation is to take place in the selected column), N5 shuts off while P6 turns on to pull COL-POWER# high. The column-loading transistors (111' and 121, not shown) turn off in response, thereby decoupling the corresponding memory block bitlines (110', 120', not shown) from the +Vcc power line and enabling a faster write time and/or reducing the amount of activation power drawn during write operations.

If WRITE# line 346 is high (meaning a read operation is taking place), P6 turns off while N5 turns on to pull COL-POWER# line 330 to logic low ("0"). This activates the column-loading transistors (111', 121', not shown) and inhibits the appearance of random noise on the bitlines.

If Write COL-SEL# line 337 is high (meaning the column is deselected), P4 turns off while N4 turns on to pull COL-POWER# line 330 to logic low ("0"). This activates the column-loading transistors (111', 121', not shown) and inhibits the appearance of random noise on the bitlines.

The above disclosure is to be taken as illustrative of the invention, not as limiting its scope or spirit. Numerous modifications and variations will become apparent to those skilled in the art after studying the above disclosure.

By way of example, field effect devices discussed above can be replaced by bipolar devices. Voltages and conductivity types may be reversed where suitable. Column-loading transistors 111 and 121 of FIG. 2 could be changed to NMOS transistors; in which case their gates would be driven by a COL-POWER signal instead of the complementary COL-POWER# signal. The bit loading means are not limited to narrow-width P-channel transistors such as 111 and 121. Combinations of resistive elements and other switching devices may be used as convenient. The column-kill mechanism is not limited to laser-cut fuses such as 171. Electrically blowable fuses or electrically-grown antifuses may be used instead. Floating gate transistors or the like may also be used as programmable means for designating as non-operational, selected ones of the memory blocks.

Given the above disclosure of general concepts and specific embodiments, the scope of protection sought is to be defined by the claims appended hereto.

What is claimed is:

1. A memory device [100,300] comprising:
   one or more data lines [118,128];
   a power line [+Vcc];
   a plurality of memory blocks for storing data, each memory block having one or more memory cells [101–10X] and each memory block having one or more bitlines [110,120] for coupling the respective memory cells [101–10X] of the memory block to the one or more data lines [118,128];
   a plurality of bitline-loading means [111,121], operatively coupled between the power line [+Vcc] and respective bitlines [110,120] of the plurality of memory blocks, for coupling the respective bitlines [110,120] to the power line [+Vcc], at least one of the bitline-loading means [111,121] being switchable to a nonloading mode that decouples the corresponding bitline from the power line [+Vcc];
   non-operational designating means [171] for designating one or more of the memory blocks as being non-operational; and
   power control means [150–160], responsive to the non-operational designating means [171] and operatively coupled to the at least one switchable bitline-loading means [111,121], for switching the at least one switchable bitline-loading means [111,121] to the nonloading mode when the corresponding memory block is designated as being non-operational by the non-operational designating means [171].

2. A memory device [100,300] according to claim 1 wherein the memory device is formed on an integrated circuit.

3. A memory device [100,300] according to claim 1 wherein the memory device is to operate as a low power device that draws no more than a prespecified amount of power, either always or when placed in a low-power mode, and one or more defects in one or plural ones of the memory blocks causes the device to draw more than said prespecified amount of power.

4. A memory device [100,300] according to claim 3 wherein the memory device is formed on a mass-producible integrated circuit.

5. A memory device [100,300] according to claim 4 wherein said the corresponding memory block of each of the at least one switchable bitline-loading means [111,121] can develop said one or more defects during production, and as a result, cause the device to draw more than said prespecified amount of power.

6. A memory device [100,300] according to claim 1 wherein at least a substantial fraction of the bitline-loading means [111,121] are each switchable to a nonloading mode that decouples the corresponding bitline from the power line [+Vcc]; and wherein the power control means [150–160] is operatively coupled to the substantial fraction of switchable bitline-loading means [111,121], for switching each of the substantial fraction of switchable bitline-loading means [111,121] to the nonloading mode when the corresponding memory block is designated as being non-operational by the non-operational designating means [171];

said substantial fraction being one which substantially increases production yield in mass production of said memory device [100,300].

7. A memory device [100,300] according to claim 6 wherein said substantial fraction constitutes at least half of the memory blocks in said memory device [100,300].

8. A memory device [100,300] according to claim 6 wherein the plurality of memory blocks include primary memory blocks and redundant memory blocks, the redundant memory blocks being provided for replacing defective ones of the primary memory blocks, and wherein said substantial fraction constitutes at least a majority of the primary memory blocks of said memory device [100,300].

9. A memory device [100,300] according to claim 1 wherein at least one memory block has two bitlines [110,120] for coupling the respective memory cells [101–10X] of the memory block to a corresponding two data lines [118,128]; and wherein two switchable bitline-loading means [111,121] are provided for the at least one memory block.

10. A memory device [100,300] according to claim 1 wherein the non-operational designating means [171] includes a fuse that is cut or blown open to designate a corresponding one of the memory blocks as being non-operational.

11. A memory device [100] according to claim 1 wherein:
the non-operational designating means [171] outputs a memory block disable signal [COL-DIS] for each memory block that can be designated as non-operational;
the power control means [150–160] includes first through third NOR gates [145,155,160] for each memory block having a bitline-loading means [111,121] that is switchable to a nonloading mode that decouples the corresponding bitline of the memory block from the power line [+Vcc]; and wherein for each memory block having a switchable bitline-loading means [111,121] and corresponding first through third NOR gates [145,155,160]:
the corresponding memory block disable signal [COL-DIS] or a complement thereof is applied to an input [153] of each of the first and second NOR gates [145,155];
outputs of the first and second NOR gates [145,155] connect to respective first and second inputs of the third NOR gate [160]; and
an output [130] of the third NOR gate switches the at least one switchable bitline-loading means [111,121].

12. A memory device [100] according to claim 11 wherein for each memory block having a switchable bitline-loading means [111,121] and corresponding first through third NOR gates [145,155,160]:
a corresponding memory block select signal [COL-SEL] is applied to a second input [136] of the first NOR gate [145]; the memory block select signal [COL-SEL] being used for addressing the corresponding memory block.

13. A memory device [100] according to claim 12 wherein for each memory block having a switchable bitline-loading means [111,121] and corresponding first through third NOR gates [145,155,160]:
a WRITE signal is applied to a second input [146] of the second NOR gate [155]; the WRITE signal being at a logic high ("1") state when data is written to a memory cell [101–10X] of the memory block.

14. A memory device [300] according to claim 1 wherein:
the non-operational designating means [371–373] outputs a memory block enable signal [COL-ENB] for each memory block that can be selectively designated as operational;
the power control means includes a power control line [330] for supplying a COL-POWER# signal to the bitline-loading means [111,121] of each corresponding memory block that can be selectively designated as operational; a corresponding first transistor [N3] for urging the power control line [330] to a logic low ("0") state in response to a logic high ("1") state of the corresponding memory block enable signal [COL-ENB]; and a corresponding second transistor [P5] for driving the COL-POWER# signal to a logic high ("1") state in response to a logic low ("0") state of the corresponding memory block enable signal [COL-ENB].

15. A memory device [300] according to claim 14 wherein:
the power control means further includes third and fourth transistors [N4,P4] responsive to a COL-SEL# signal [337], where the COL-SEL# signal [337] is brought to a logic low ("0") state for addressing the corresponding memory block, where the third transistor [N4] urges the power control line [330] to a logic low ("0") state in response to a logic high ("1") state of the corresponding COL-SEL# signal [337], and where the fourth transistor [P4] urges the power control line [330] to a logic high ("1") state in response to a logic low ("0") state of the corresponding COL-SEL# signal [337].

16. A memory device [300] according to claim 15 wherein:

the power control means further includes fifth and sixth transistors [N5,P6] responsive to a WRITE# signal [346], where the WRITE# signal [346] is brought to a logic low ("0") state for writing data into a memory block of the memory device [300], where the fifth transistor [N5] urges the power control line [330] to a logic low ("0") state in response to a logic high ("1") state of the WRITE# signal [346], and where the sixth transistor [P6] urges the power control line [330] to a logic high ("1") state in response to a logic low ("0") state of the WRITE# signal [346].

17. A memory device [300] according to claim 1 wherein said one or more memory cells [101-10X] are Static Random Access Memory (SRAM) cells.

18. A memory device [300] according to claim 1 wherein said one or more memory cells [101-10X] are Electrically Programmable ROM (EPROM) cells.

* * * * *